(12) United States Patent
Akagi et al.

(10) Patent No.: US 6,595,803 B2
(45) Date of Patent: Jul. 22, 2003

(54) CARD CONNECTOR

(75) Inventors: Toshimasa Akagi, Hachioji (JP);
Akifumi Kabeya, Sagamihara (JP);
Tatsuyuki Uemura, Tachikawa (JP);
Takashi Suzuki, Chofu (JP); Hideki Okuyama, Sagamihara (JP); Takuji Hanyu, Tokyo (JP)

(73) Assignees: Olympus Optical Co., Ltd., Tokyo (JP); Molex Japan Co., Ltd., Yamato (JP)

( * ) Notice: Subject to any disclaimer, the term of this patent is extended or adjusted under 35 U.S.C. 154(b) by 0 days.

(21) Appl. No.: 09/995,310

(22) Filed: Nov. 27, 2001

(65) Prior Publication Data
US 2002/0094726 A1 Jul. 18, 2002

(30) Foreign Application Priority Data
Nov. 28, 2000 (JP) ........................................ 2000-361590

(51) Int. Cl.[7] .............................................. H01R 24/00
(52) U.S. Cl. ........................ 439/630; 439/159; 439/326
(58) Field of Search ................................ 439/630, 159, 439/326; 361/684, 756, 740, 747; 429/97, 99, 100

(56) References Cited

U.S. PATENT DOCUMENTS 5,673,180 A * 9/1997 Pernet .......................... 361/576
5,781,232 A * 7/1998 Ejima .......................... 348/233
5,971,780 A * 10/1999 Youn ............................ 439/160

FOREIGN PATENT DOCUMENTS

| JP | 08-007980 | 1/1996 |
| JP | 08-167009 | 6/1996 |
| JP | 11-17792 A | 1/1999 |

* cited by examiner

Primary Examiner—Alexander Gilman
(74) Attorney, Agent, or Firm—Frishauf, Holtz, Goodman & Chick, P.C.

(57) ABSTRACT

A card connector is provided which includes a stopper mechanism for functioning in such a manner that in a case where a memory card is inserted and attached to a connector, the memory card is prevented from being detached from the connector, or even when the card is detached, the detachment is restricted within a detachment allowable range where electrical connection is not influenced. The card connector is carried in a portable information terminal apparatus to prevent connector detachment caused due to an external impact.

8 Claims, 5 Drawing Sheets

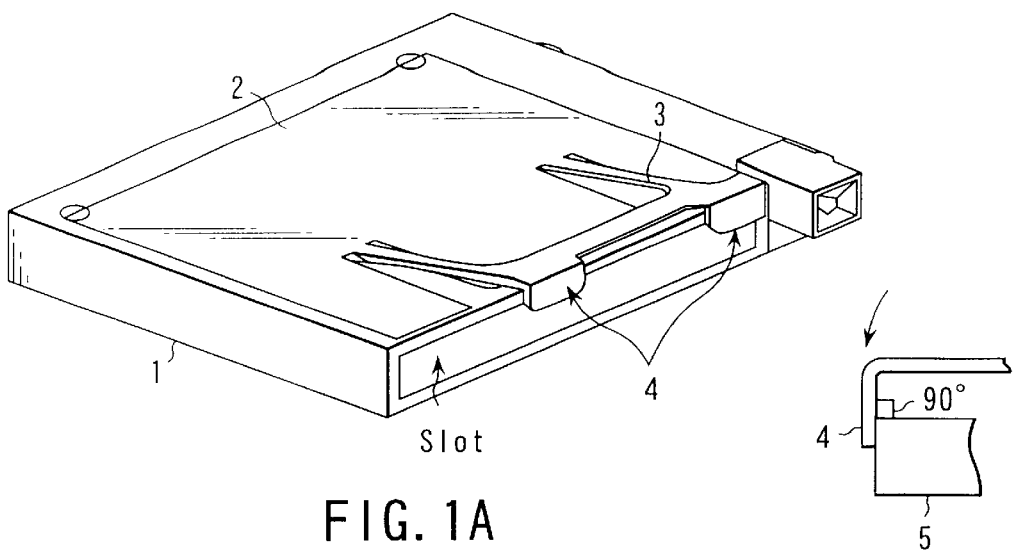
FIG. 1A
FIG. 1B
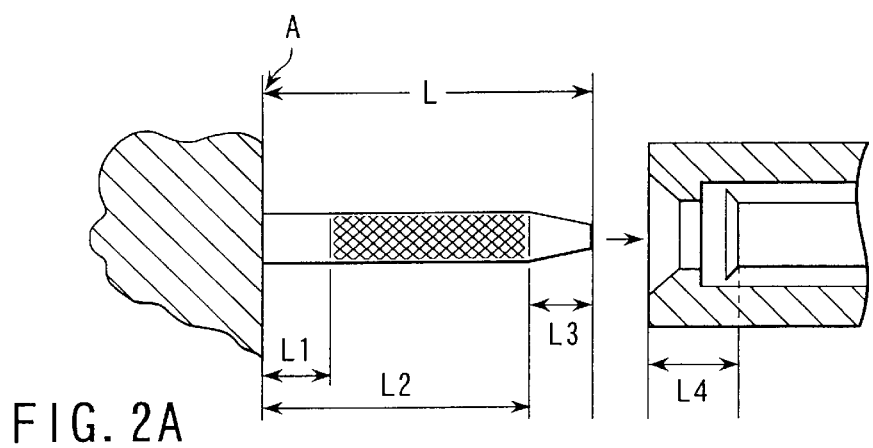
FIG. 2A
FIG. 2B

CARD CONNECTOR

CROSS-REFERENCE TO RELATED APPLICATIONS

This application is based upon and claims the benefit of priority from the prior Japanese Patent Application No. 2000-361590, filed Nov. 28, 2000, the entire contents of which are incorporated herein by reference.

BACKGROUND OF THE INVENTION

1. Field of the Invention

The present invention relates to a connector to which a detachable card-shaped storage medium is fitted in a portable information terminal apparatus having an electronic device therein and, more particularly, to a connector in which an improvement in prevention of detachment of the card-shaped storage medium due to an impact is made.

2. Description of the Related Art

Generally, as a portable information terminal apparatus having an electronic device therein, various apparatuses such as a radio communication device such as a cellular phone, a personal computer, a remote-control unit, and a handy-type barcode reader have been known.

Since the portable information terminal apparatus is manufactured with emphasis on reduction in size and weight, basic functions and basic performance capabilities are narrowed to reduce parts to be carried to some extent. Accordingly, the apparatus has a connector constitution in which a built-in electronic device can be added or replaced detachably. Various built-in electronic devices having an optional function is attached as necessary.

As a built-in electronic device, for example, there is a card-shaped storage medium (hereinbelow, referred to as a memory card) in which a flash memory for storing data is carried. Generally, there is a limit in the storage capacity of a main memory in a main body of the apparatus. Accordingly, basic software and main application software are stored in the main memory and data is stored in the detachable memory card.

As to attachment, in many cases, the above-mentioned built-in electronic device such as a memory card is inserted into a slot and is then fitted to a connector. To realize easy attachment or detachment of the device by the user, the device is merely inserted, whereby the attachment is completed without fixing with a screw. Ordinarily, the user carries the portable information terminal apparatus. Accordingly, due to carelessness, an external impact is applied to the apparatus in many cases (for example, when the user bumps or drops the apparatus).

In consideration of this fact, the apparatus main body has a constitution or cover to absorb the impact to avoid damage. In the built-in electronic device as well, when receiving the impact, the device may be detached from the connector. When the connector detachment occurs, data cannot be transmitted or received. As to data which is not recorded yet, a power source must be turned off to again attach the memory card in some cases. At that time, the unrecorded data may be lost. And when the apparatus is operated in a state in which the memory card is partly detached, the memory card itself may be damaged.

As a measure for preventing the connector detachment, for example, according to Jpn. Pat. Appln. KOKAI Publication No. 8-7980 (refer to FIGS. 5A and 5B) and Jpn. Pat. Appln. KOKAI Publication No. 8-167009 (refer to FIGS. 6A to 6C), it is disclosed that fall-preventing means is provided for a mechanism for ejecting a card.

In the disclosed arts, the fall-preventing means for preventing connector detachment is provided for the card ejecting mechanism. An ejection button 18 is provided to be exposed on the outside. When an external impact caused by fall or the like is applied to the ejection button 18, the function of the fall-preventing means is released due to the impact. Alternatively, the ejection button 18 may be pressed to eject the card to the outside.

However, according to the related art, when the external impact is applied, detachment of a card 5 from a connector is not prevented completely.

BRIEF SUMMARY OF THE INVENTION

It is an object of the present invention to provide a card connector in which a stopper mechanism with a simple constitution is provided to be able to prevent an attached memory card that is detachable from being detached from a connector even when an external impact is applied.

To accomplish the above object, according to the present invention, there is provided a card connector in which a detachable card-shaped storage medium is attached to be electrically connected to an external device, the card connector including: a connecting terminal for transmitting or receiving a signal from/to the external device to/from the card-shaped storage medium; a connector main body to which the card-shaped storage medium is inserted to be held; and a stopper mechanism for preventing the card-shaped storage medium from being detached from the connector.

The stopper mechanism may be integrally provided for the connector and include a restricting member for restricting the movement of the card-shaped storage medium in the detaching direction (opposite to the attaching direction).

The restricting member may include a cantilever-shaped elastic member integrally provided for the connector. The restricting member may include a U-shaped elastic member integrally provided for the connector and a nail portion, which is provided on the side opposite to the portion where the elastic member is connected to the connector, for restricting the movement of the card-shaped storage medium.

The restricting member may include an elastic member constituted so as to be changeable between a first state in which the card-shaped storage medium can be detached from the connector and a second state in which the card-shaped storage medium is inhibited from being detached from the connector.

BRIEF DESCRIPTION OF THE SEVERAL VIEWS OF THE DRAWING

FIGS. 1A and 1B are diagrams showing a card connector according to a first embodiment of the present invention;

FIGS. 2A and 2B are diagrams explaining a detachment allowable range in connector detachment;

DETAILED DESCRIPTION OF THE INVENTION

Figure 3A:
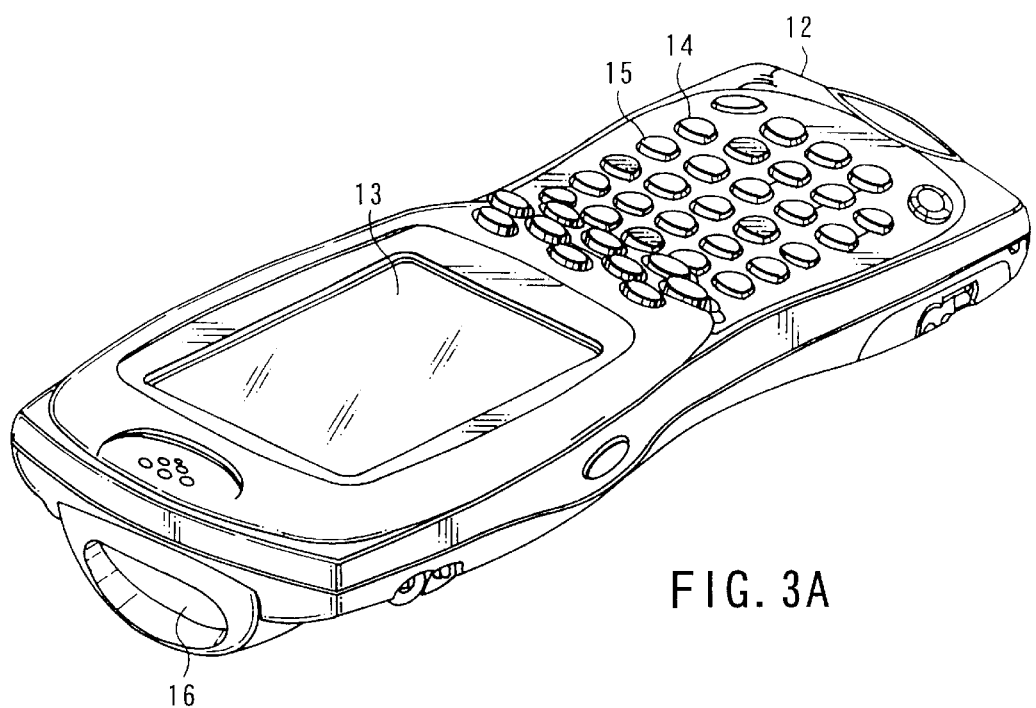
FIGS. 3A and 3B are external views of the external constitution of a portable information terminal apparatus having a barcode reading function as an example of an external device in which the card connector of the present invention is carried.

Hereinbelow, an embodiment of the present invention will now be described in detail with reference to the drawings.

FIG. 1A shows a constitutional example of a card connector having a stopper mechanism for preventing connector detachment according to the embodiment of the present invention.

The stopper mechanism, which is used in the card connector, comprises a stopper member 2 made of metal such as stainless steel attached to a connector main body 1. In the stopper member 2, a U-shaped lock plate spring portion 3 is formed and two nail portions 4 are formed on both sides of the member. Referring to FIG. 1B, the nail portions 4 are bent so as to be engaged in parallel with the rear surface of the memory card 5 when the nail portions are set to detachment-preventing positions. In this case, the nail portions 4 are bent at 90° with respect to the principal plane of the memory card 5. The angle is not limited to the above. Any angle at which the nail portions are engaged with the rear surface of the memory card 5 to fix the card can be set.

The stopper member 2 is formed in such a manner that a steel plate of stainless steel is stamped and is then bent. The material is not limited to the steel plate. Any material in which the accuracy of each dimension in manufacturing is maintained and which resists deformation or bending caused by heat can be used. When conditions are satisfied, the stopper member can be made of resin.

Subsequently, positional relation between the connector main body 1 and the stopper member 2 upon attachment will now be described with reference to FIGS. 2A and 2B. To explain more specifically, "CompactFlash (registered trademark: omitted hereinbelow)" in which a flash memory is carried is used as an example of the memory card 5 and the explanation will be made according to the specifications thereof.

According to the present embodiment, when a CompactFlash is attached, the U-shaped lock plate spring portion 3 is moved downward on the rear surface side (opposite to the side on which a connector terminal is arranged) of the CompactFlash to engage the nail portions 4 with the rear surface of the CompactFlash, thereby preventing the CompactFlash from being detached from a connector. It is important to set a distance LA from a position of the connector (reference plane A) to a position to which the U-shaped lock plate spring portion 3 is moved downward. In other words, when the connector terminal of the CompactFlash begins to be detached from a connector pin, a range where the connector terminal is electrically connected to the connector pin and the operation is not influenced completely is set as a "detachment allowable range". On the basis of the detachment allowable range, the distance LA has to be set.

To set the detachment allowable range of the CompactFlash, detecting pins disposed on both sides of the connector are used. According to the specifications of the well-known CompactFlash, the length (case length) on the side where the connector is arranged is set to 36.4±0.15 mm. As shown in FIG. 2A, the length L of the detecting pin is defined to 3.5±0.1 mm, a portion L2 where actual electrical connection is made is defined to 3.0±0.1 mm, and a guide portion L3 at the end of the pin is defined to 0.5±0.1 mm. A detecting-pin connector terminal of the CompactFlash is located backward from other pin connector terminals as observed from a contact plane (reference plane A). A distance L4 is defined to 0.5 to 2.5 mm (in this case, 1.5±1.0 mm).

Accordingly, as shown in FIG. 2B, when the CompactFlash is actually inserted, a distance X where the detecting pin is come into contact with the connector terminal is obtained as follows:

$$X = L - L3 - L4$$

When this expression is simply accumulated in accordance with the above-mentioned specifications, X=1.5±1.2 mm, namely, 0.3≦X≦2.7 mm.

In other words, when the detecting pin comes off by 0.3 mm at the minimum, such a state is recognized as connector detachment. As mentioned above, however, the length of CompactFlash is set to 36.25 mm at the minimum to 36.55 mm at the maximum. A difference therebetween is 0.3 mm.

Accordingly, in a case where the distance LA is set to a CompactFlash having a length of 36.55 mm, even when a CompactFlash having a length of 36.25 mm is attached to be normally inserted up to the contact plane, a gap of 0.3 mm exists between the CompactFlash and the U-shaped lock plate spring portion 3. When the CompactFlash is detached to come into contact with the plate spring portion 3, it is determined that the detecting pin comes out.

However, the case is obtained on the assumption of the simple accumulation. When a person skilled in the art uses the well-known square-root law accumulation, X=1.5±1.01 mm, namely, 0.49≦X≦2.51 mm. Accordingly, when the detecting pin comes out by 0.49 mm, detachment is determined. In the square-root law accumulation, the following expression is used:

$$D = M \pm \sqrt{\sum (Xi - Xbar)^2}$$

where,
D: accumulation dimension,
M: accumulation population mean,
Xi: upper limit of each dimension, and
Xbar: median of each dimension.

According to the present embodiment, in the above-mentioned constitution, due to the stopper mechanism having the U-shaped lock plate spring portion 3, after the memory card 5 is inserted into the slot, the U-shaped lock plate spring portion 3 is pressed down from the above by some member to engage the nail portions 4 with the rear of the memory card 5. As mentioned above, the U-shaped lock plate spring portion 3 is integrally attached to the connector main body 1 into which the memory card 5 is inserted. Accordingly, so long as the nail portions 4 are engaged with the rear of the memory card 5, even when an impact is applied to the memory card 5 inserted in the connector, a distance where the memory card 5 is detached can be restricted within a range where the electrical connection is maintained. Consequently, the connector detachment can be prevented.

Figure 3B:
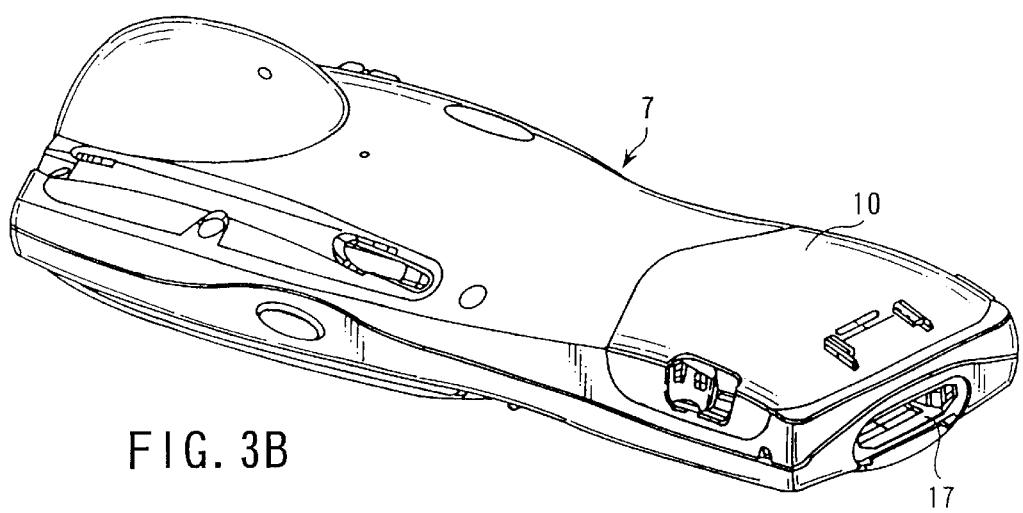

Subsequently, a case where the present invention is applied to a portable information terminal apparatus having a barcode reading function as an example of the external device in which the above-mentioned card connector is arranged will now be described. FIG. 3A shows an external view of the portable information terminal apparatus obliquely observed from the above in the front. FIG. 3B shows the constitution on the rear side obliquely observed from the above.

In a processing apparatus 12, a display section 13 to display a character, a number, and other information and an input section 15 in which a plurality of keys 14 are arranged are provided on the front side. On the upper side, a beam window 16 for irradiating beam light for reading and receiving reflected light to read data is provided. On the rear side, a battery compartment cover 10 is fitted to a main body rear cover 7. A connector portion 17 to be connected to the outside is provided on the bottom. When the battery compartment cover 10 is detached, in a battery compartment (not shown), a battery receiving portion and the card connector main body 1 to which the card-shaped storage medium is attached are provided.

Figure 4A:
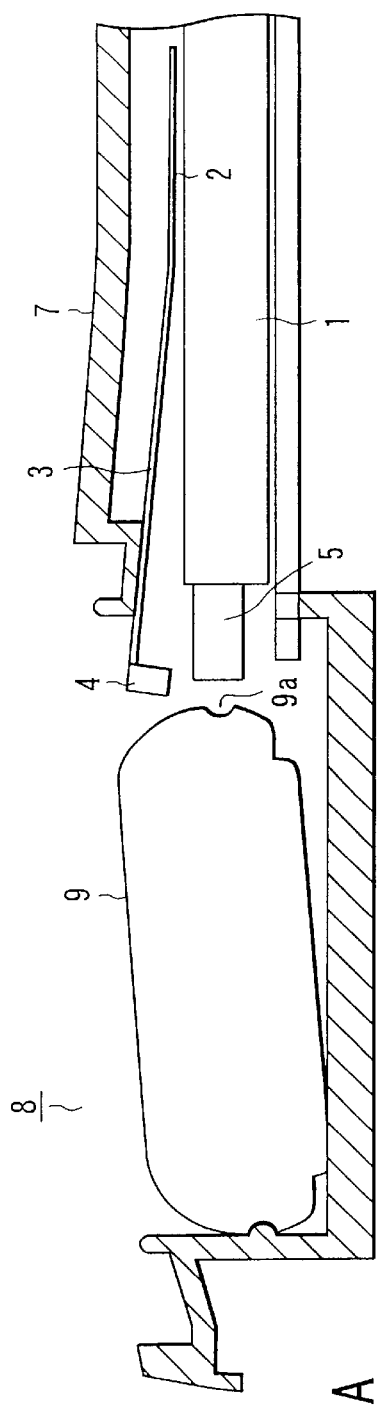
FIGS. 4A and 4B are sectional views showing the constitution of the portable information terminal apparatus shown in FIG. 3A.
Figure 4B:
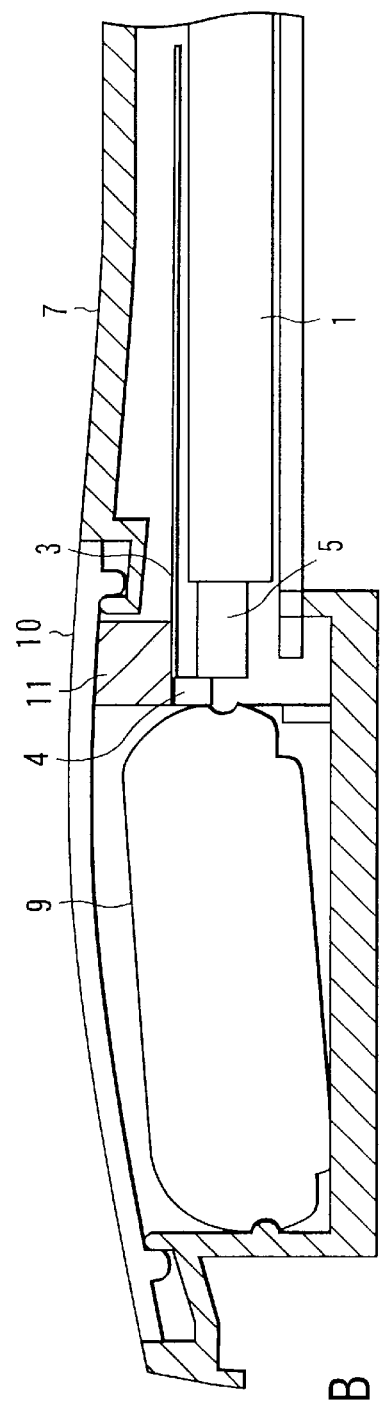
Figure 5A:
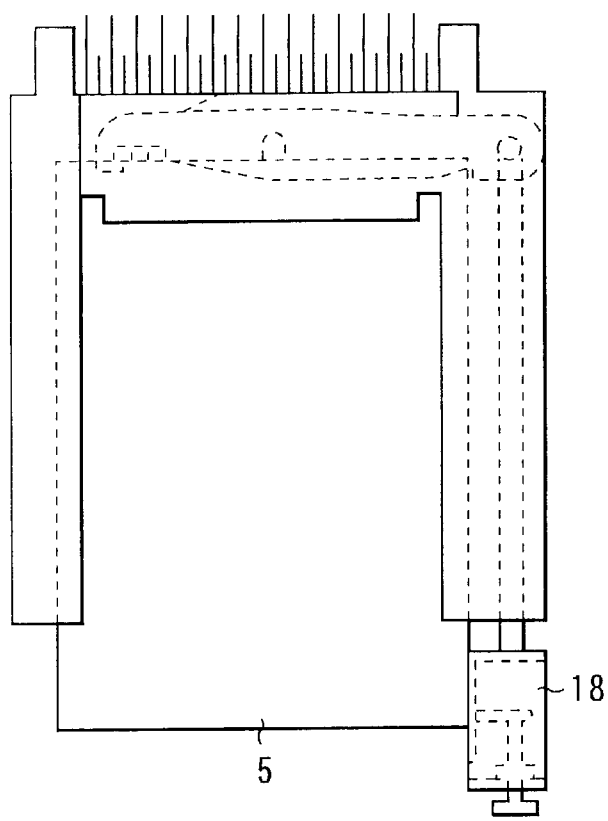
FIGS. 5A and 5B are diagrams showing the related art of the card connector for preventing connector detachment.
Figure 5B:
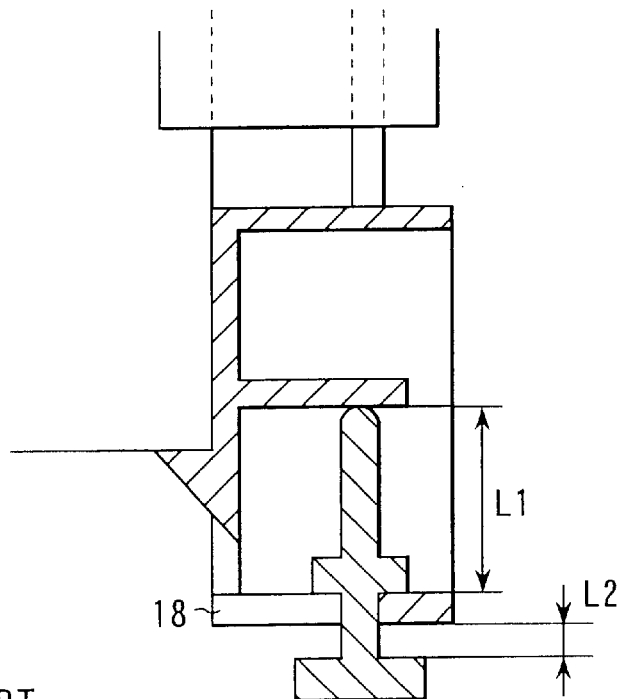
Figure 6A:
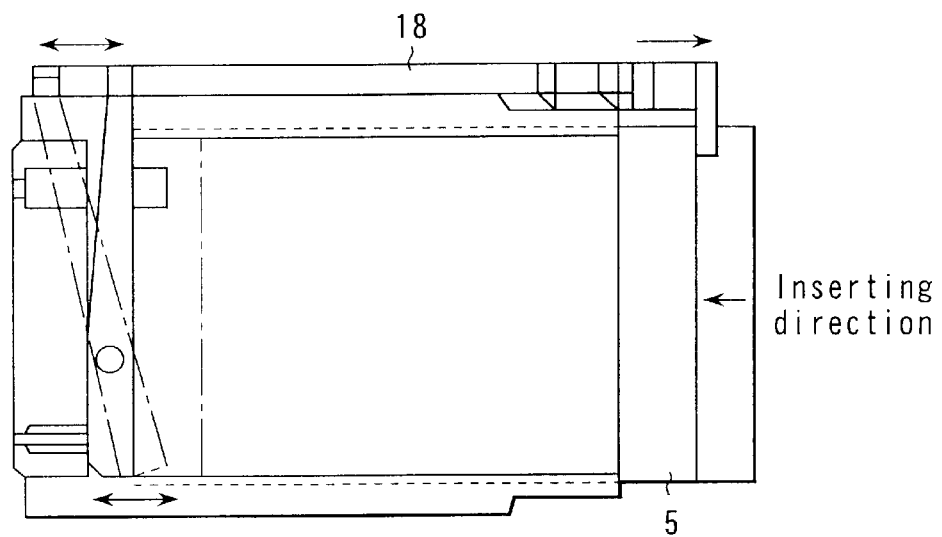
FIGS. 6A, 6B, and 6C are diagrams showing another related art of the card connector for preventing the connector detachment.
Figure 6B:
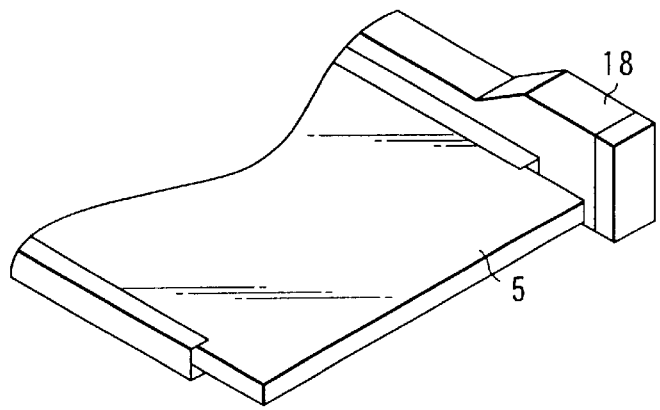
Figure 6C:
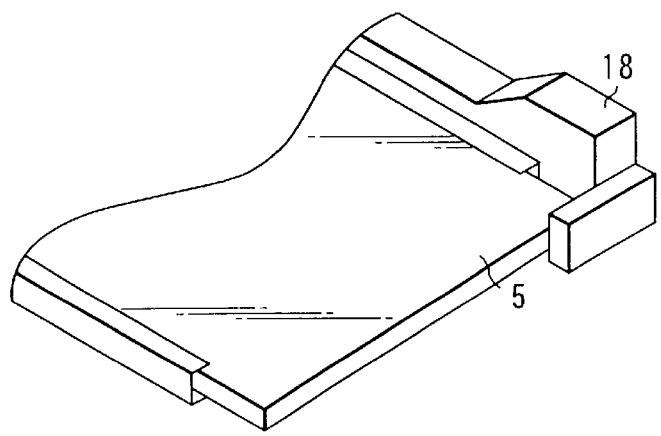

FIGS. 4A and 4B show sectional views of the constitution of the portable information terminal apparatus shown in FIG. 3A. FIG. 4A shows a state in which a battery is received. FIG. 4B shows a state in which the battery compartment cover is fitted to allow the stopper mechanism to function to prevent the memory card from being detached.

As shown in FIG. 4A, an insertion slot of the connector main body 1 to which the memory card 5 is inserted is opened to a battery compartment 8. The memory card 5 is inserted into the connector main body 1 and, after that, a battery 9 is loaded in the battery compartment 8. After that, as shown in FIG. 4B, when the battery compartment cover 10 is attached, a projecting portion 11 formed on the rear surface of the battery compartment cover 10 pushes the U-shaped lock plate spring portion 3 provided for the connector main body 1 downward, so that the nail portions 4 are engaged with the rear surface of the memory card 5. Consequently, the nail portions 4 function as stoppers to prevent the memory card 5 from being detached.

As mentioned above, when the memory card is attached to the card connector, the card is prevented from being detached from the connector on the rear surface side of the card. Alternatively, when the detachment occurs, the stopper mechanism restricts the detachment within a detachment allowable range where electrical connection is not influenced. Since such a stopper mechanism is provided, the connector detachment caused by an external impact can be prevented.

As a memory card attached to the connector, Compact-Flash has been explained as an example. Memory cards such as SmartMedia (registered trademark), SDMemoryCard (trademark), MemoryStick (trademark), and MMC (MultiMediaCard: trademark) which are currently used and each of which comprises a semiconductor memory device can also be used similarly. Not only the semiconductor memory device but also a magnetic recording medium such as a hard disk, a magnetooptical disk medium, an optical recording medium such as a CD-R, and other card-shaped devices, each of which is attached to a card connector to be electrically connected thereto and is then operated, can be used similarly.

As described in detail, according to the present invention, there can be provided the card connector in which the stopper mechanism with a simple constitution is provided to be able to prevent an attached built-in electronic device, the device being detachable, from being detached from the connector even when an external impact is applied.

What is claimed is:

1. A card connector in which a detachable card-shaped storage medium is attached to be electrically connected to an external device, the connector comprising:

a connecting terminal for transmitting or receiving a signal from/to the card-shaped storage medium;

a connector main body to which the card-shaped storage medium is inserted to be held; and a stopper mechanism for preventing the card-shaped storage medium from being detached from the connector;

wherein the stopper mechanism is attached to the connector and comprises a restricting member for restricting movement of the card-shaped storage medium in a detaching direction; and wherein an opening through which the card-shaped storage medium is inserted is opened so as to face a battery receiving compartment of an electronic device, and a cover for closing the battery receiving compartment moves the stopper mechanism into a position from which the stopper mechanism functions to prevent the card-shaped storage medium from being detached from the connector.

2. The connector according to claim 1, wherein the restricting member comprises a cantilever-shaped elastic member integrally formed with the connector.

3. The connector according to claim 2, wherein the elastic member comprises one of a steel plate and a resin member having bending properties.

4. The connector according to claim 1, wherein the restricting member comprises a U-shaped elastic member integrally formed with the connector and a nail portion for restricting the movement of the card-shaped storage medium in the detaching direction.

5. The connector according to claim 4, wherein the elastic member comprises one of a steel plate and a resin member having bending properties.

6. The connector according to claim 1, wherein the restricting member comprises an elastic member adapted to be moved between a first position in which the card-shaped storage medium can be attached or detached to/from the connector and a second position in which the card-shaped storage medium is inhibited from being detached from the connector.

7. The connector according to claim 6, wherein the elastic member comprises one of a steel plate and a resin member having bending properties.

8. A card connector in which a detachable card-shaped storage medium is attached to be electrically connected to an external device, the connector comprising:

a connecting terminal for transmitting or receiving a signal from/to the card-shaped storage medium;

a connector main body to which the card-shaped storage medium is inserted to be held; and a stopper mechanism for preventing the card-shaped storage medium from being detached from the connector;

wherein the stopper mechanism comprises an elastic restricting member adapted to be moved between a first position in which the card-shaped storage medium can be attached or detached to/from the connector and a second position in which the card-shaped storage medium is inhibited from being detached from the connector; and wherein the elastic restricting member is adapted to be moved from the first position to the second position by a cover member of an electronic device in which said connector is provided.

* * * * *